United States Patent
Kuo et al.

(10) Patent No.: US 9,343,556 B2
(45) Date of Patent: May 17, 2016

(54) METHODS AND APPARATUS FOR ESD PROTECTION CIRCUITS

(71) Applicant: Taiwan Semiconductor Manufacturing Company, Ltd., Hsin-Chu (TW)

(72) Inventors: Hsi-Yu Kuo, Hsin-Chu (TW); Chi-Kuang Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/763,374

(22) Filed: Feb. 8, 2013

(65) Prior Publication Data

US 2014/0225158 A1  Aug. 14, 2014

(51) Int. Cl.
*H01L 29/74* (2006.01)
*H01L 29/66* (2006.01)
*H01L 27/02* (2006.01)

(52) U.S. Cl.
CPC ............ *H01L 29/74* (2013.01); *H01L 27/0262* (2013.01); *H01L 29/66363* (2013.01)

(58) Field of Classification Search
CPC ............ H01L 27/0259; H01L 27/0262; H01L 29/735
USPC .......................................... 257/173–577, 592
See application file for complete search history.

(56) References Cited

U.S. PATENT DOCUMENTS

| | | | | |
|---|---|---|---|---|
| 4,652,895 A | * | 3/1987 | Roskos | 257/551 |
| 5,212,398 A | * | 5/1993 | Matsunaga et al. | 257/356 |
| 7,456,441 B2 | * | 11/2008 | Tyler | H01L 27/0262 257/173 |
| 2006/0043489 A1 | | 3/2006 | Chen et al. | |
| 2009/0108406 A1 | * | 4/2009 | Sato | 257/566 |
| 2011/0248383 A1 | * | 10/2011 | Ren et al. | 257/577 |
| 2013/0082353 A1 | * | 4/2013 | Kuo | H01L 29/735 257/591 |

* cited by examiner

*Primary Examiner* — Jerome Jackson, Jr.
*Assistant Examiner* — Fang-Xing Jiang
(74) *Attorney, Agent, or Firm* — Slater Matsil, LLP

(57) ABSTRACT

Methods and apparatus are disclosed for ESD protection circuits. An ESD protection circuit may comprise a lateral silicon controlled rectifier (SCR) circuit and a lateral PNP bipolar junction transistor (BJT) circuit. The SCR circuit comprises a first region on an n type buried layer (NBL), a second region on the NBL, a fourth region formed within the first region, and a fifth region formed within the second region. The PNP circuit comprises the second region on the NBL, a third region on the NBL, and a sixth region formed within the third region. The first region is the $1^{st}$ N node of the SCR circuit and is connected with the base of the PNP circuit, which is the third region, by the NBL, and the $2^{nd}$ P node of the SCR circuit is shared with the collector of the PNP circuit.

20 Claims, 9 Drawing Sheets

METHODS AND APPARATUS FOR ESD PROTECTION CIRCUITS

BACKGROUND

Electrostatic discharge (ESD) is the sudden flow of electricity between two objects caused by contact, an electrical short, or dielectric breakdown. ESD can be caused by a buildup of static electricity by tribocharging, or by electrostatic induction. ESD includes spectacular electric sparks, but also less dramatic forms which may be neither seen nor heard, yet still be large enough to cause damage to sensitive electronic devices. ESD can cause a range of harmful effects, as well as failure of integrated circuits (ICs).

Electrostatic discharge ("ESD") protection circuits are needed for ICs. The ESD protection circuits provide a path to bypass current from the terminal to a ground or from the terminal to a power supply rail, so that the current due to an ESD event bypasses the internal circuitry. Voltages far in excess of the normal operating voltages, in both positive and negative magnitudes, are observed during short duration electrostatic discharge events. The ESD protection circuits prevent the corresponding ESD current from destroying sensitive components in the protected IC.

An ESD protection circuit can be triggered in response to a trigger voltage over a threshold, and then safely conduct ESD stress current through an alternative path and thus protect the internal circuitry. After the ESD protection circuit is triggered, it will remain active as long as a voltage over a "holding voltage" is present.

Snapback devices such as silicon controlled rectifier (SCR) circuits and bipolar junction transistors (BJTs) may be used as ESD protection circuits. However, SCR circuits may have potential burn out risks caused by mistakenly triggered ESD events since the trigger voltage of a SCR circuit may change when ESD events generate waveforms with different rising times. On the other hand, the PNP BJTs may have a larger area requirement which may prevent them from being used in many cases, even though they may be safer and more suitable for more applications. Improved ESD protection circuits are needed.

BRIEF DESCRIPTION OF THE DRAWINGS

For a more complete understanding of the illustrative embodiments, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example embodiments and are not necessarily drawn to scale.

DETAILED DESCRIPTION

Figure 1A:
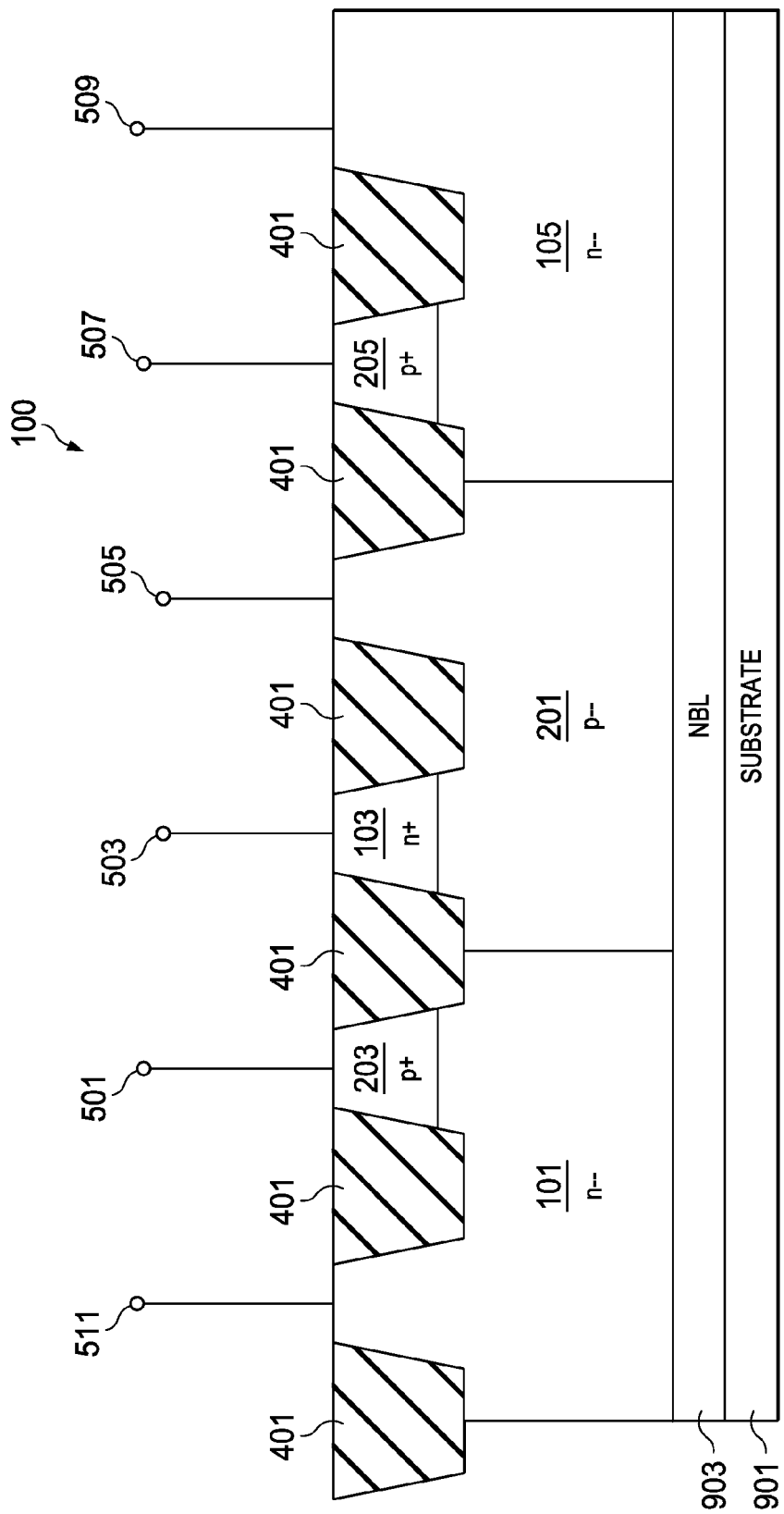
FIGS. 1(a)-1(b) illustrate in a cross sectional view and a circuit diagram of an embodiment of an ESD protection circuit.

The making and using of illustrative example embodiments are discussed in detail below. It should be appreciated, however, that an illustrative embodiment provides many applicable inventive concepts that can be embodied in a wide variety of specific contexts. The embodiments herein are illustrative examples used for explanation but do not limit the scope of the disclosure, and do not limit the scope of the appended claims.

Methods and apparatus are disclosed for ESD protection circuits. An ESD protection circuit may comprise a lateral silicon controlled rectifier (SCR) circuit and a lateral PNP bipolar junction transistor (BJT) circuit, where the $1^{st}$ N node of the SCR circuit is connected with the base of the PNP circuit by an n type barrier layer (NBL), and the $2^{nd}$ P node of the SCR circuit is shared with the collector of the PNP circuit. Since the $1^{st}$ N node of the SCR circuit is connected to the base of the PNP circuit by the NBL, the ESD circuit can avoid the potential burn out risks caused by mistakenly triggered ESD events because the trigger voltage of the ESD circuit is tied to the trigger voltage of the PNP circuit, while the trigger voltage of a SCR circuit alone may change when ESD events generate waveforms with different rising times.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1(a) illustrates in a cross sectional view an embodiment of an ESD protection circuit 100. Semiconductor manufacturing processes that may be used to form the ESD protection circuit 100 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, tetraethoxysilane (TEOS), spun on glass and other oxide and nitride depositions, planarization processes such as chemical mechanical planarization (CMP), forming isolation regions using trenches or local oxidation of silicon (LOCOS) and the like.

In FIG. 1(a), a portion of a semiconductor substrate 901 is shown. The semiconductor substrate 901 may be a p type doped substrate, or an n type doped substrate, which means that the semiconductor substrate 901 may be doped with either n type or p type impurities. The semiconductor substrate 901 may be formed from silicon, gallium arsenide, silicon germanium or other known semiconductor materials used in semiconductor device processing. Although in the illustrated examples presented herein for explanation a semiconductor substrate is used, in other alternative embodiments epitaxially grown semiconductor materials may be used, or, silicon on insulator (SOI) layer may be used, as the substrate 901.

As it is known, dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorus, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers, as is known.

The doping concentration amounts for the well region and the diffusions described may vary with the process used and the particular design. Concentrations at a material following the doping may range from $1E14$ atoms/cm$^3$ to $1E22$ atoms/cm$^3$, with a p+/n+ material with concentrations being greater than about $1E18$/cm$^3$, for example. Some other ranges of concentrations may be used, such as a n−−/p−− material with a doping concentration less than $1E14$ atoms/cm$^3$, a n−/p− material with a doping concentration ranging from $1E14$ atoms/cm$^3$ to $1E16$ atoms/cm$^3$, a n/p material with a doping concentration ranging from $1E16$ atoms/cm$^3$ to $1E18$ atoms/cm$^3$, a n+/p+ material with a doping concentration ranging from $1E18$ atoms/cm$^3$ to $1E20$ atoms/cm$^3$, and a n++/p++ material with a doping concentration ranging larger than $1E20$ atoms/cm$^3$. Further alternative ranges of concentrations may be used, such as a n−−/p−− material doping concentration with a range around $10^{15}$~$10^{18}$/cm$^3$, and a n−/p− material doping concentration is 5~100 times heavier than the concentration of a n−−/p−− material.

In FIG. 1(a), the ESD protection circuit 100 comprises a first region 101, a second region 201, and a third region 105 on an n type barrier layer (NBL) 903, where the NBL 903 is above the substrate 901. The first region 101 is shown to comprise an n−− type material, yet any other n type material may be used. The second region 201 is shown to comprise a p−− type material, yet any other p type material may be used. The third region 105 is shown to comprise an n−− type material, yet any other n type material may be used. The second region 201 is formed proximate to and adjacent to the first region 101 and the third region 105.

An isolation area 401 is formed cross the boundary of the first region 101 and the second region 201, and another isolation area 401 is formed cross the boundary of the second region 201 and the third region 105. Additional isolation area 401 may be formed within each region 101, 201, and 105. The isolation area 401 may be formed, for example, using shallow trench isolation (STI), where an oxide, nitride or similar dielectric is formed in a trench region. Alternative embodiments include local oxidation of silicon (LOCOS) isolation, or any other form of isolations.

A fourth region 203 is formed within the first region 101 between two isolation areas. A fifth region 103 is formed within the second region 201 between two isolation areas. A sixth region 205 is formed within the third region 105 between two isolation areas. The fourth region 203 is shown to comprise a p+ type material, yet any other p type material may be used. The fifth region 103 is shown to comprise an n+ type material, yet any other n type material may be used. The sixth region 205 is shown to comprise a p+ type material, yet any other p type material may be used.

A contact 511 is formed in connection with the first region 101. A contact 501 is formed in connection with the fourth region 203. A contact 503 is formed in connection with the fifth region 103. A contact 505 is formed in connection with the second region 201. A contact 507 is formed in connection with the sixth region 205. A contact 509 is formed in connection with the third region 105.

Figure 1B:
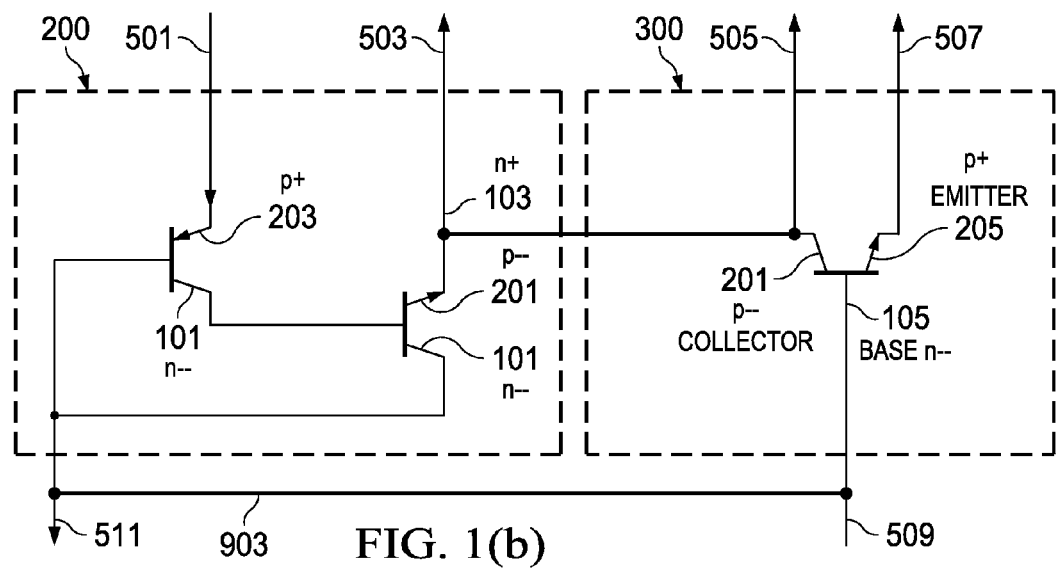

The four regions, the fourth region 203 comprising a p type material contained within the first region 101, the first region 101 comprising an n type material, the second region 201 comprising a p type material adjacent to the first region 101, and the fifth region 103 comprising an n type material contained within the second region 201, form a PNPN structure for a SCR circuit 200, as shown in FIG. 1(b) in a circuit schematic diagram. The first P node is the fourth region 203 comprising a p type material. The first N node is the first region 101 comprising an n type material. The second P node is the second region 201 comprising a p type material. The second N node is the fifth region 103 comprising an n type material. The contact 511 is connected with the $1^{st}$ N node, which is the first region 101. The contact 501 is connected with the 1st P node, which is the fourth region 203. The contact 503 is connected to the second N node, which is the fifth region 103.

On the other hand, the three regions, the second region 201 comprising a p type material, the third region 105 comprising an n type material adjacent to the second region 201, and the sixth region 205 comprising a p type material contained within the third region 105, form a PNP circuit 300, as shown in FIG. 1(b) in a circuit schematic diagram. The third region 105 comprising an n type material is the base for the PNP circuit 300. The second region 201 comprising a p type material is the collector for the PNP circuit 300. The sixth region 205 comprising a p type material is the emitter for the PNP circuit 300. The second region 201 acts both as the collector for the PNP circuit 300, and also as the second P node for the SCR circuit 200. Furthermore, the third region 105 and the first region 101 both comprise an n type material, and they are connected by the NBL 903 as shown in FIG. 1(a) and FIG. 1(b).

As illustrated in FIG. 1(a), the NBL 903 is above the substrate 901 and under the first region 101, the second region 201, and the third region 105, connecting the third region 105 and the first region 101 since they both comprise an n type material. The NBL 903 may also serve as a barrier against the movement of electrons and holes of a semiconductor. The NBL 903 may be formed as a deep n type well, for example. The NBL 903 connects the first region 101, which is the 1st N node of the SCR circuit 200, to the third region 105, which is the base of the PNP circuit 300. Since the 1st N node of the SCR circuit is connected to the base of the PNP circuit by the NBL, the ESD circuit 100 can avoid the potential burn out risks caused by mistakenly triggered ESD events because the trigger voltage of the ESD circuit is tied to the trigger voltage of the PNP circuit 300, while the trigger voltage of a SCR circuit 200 alone may change with ESD waveforms with different rising time.

Different n type material may be used for the first region 101 comprising a first n type material, the third region 105 comprising a second n type material, and the fifth region 103 comprising a third n type material contained within the second region 201. For example, an n− type material may be used for the first region 101, instead of an n−− type shown in FIG. 1(a). Different p type material may be used for the second region 201 comprising a first p type material, the fourth region 203 comprising a second p type material contained within the first region 101, and the sixth region 205 comprising a third p type material contained within the third region 105. For example, a p− type material may be used for the second region 201, instead of an p−− type shown in FIG. 1(a). Many of the variations of the embodiments are not shown.

Figure 2A:
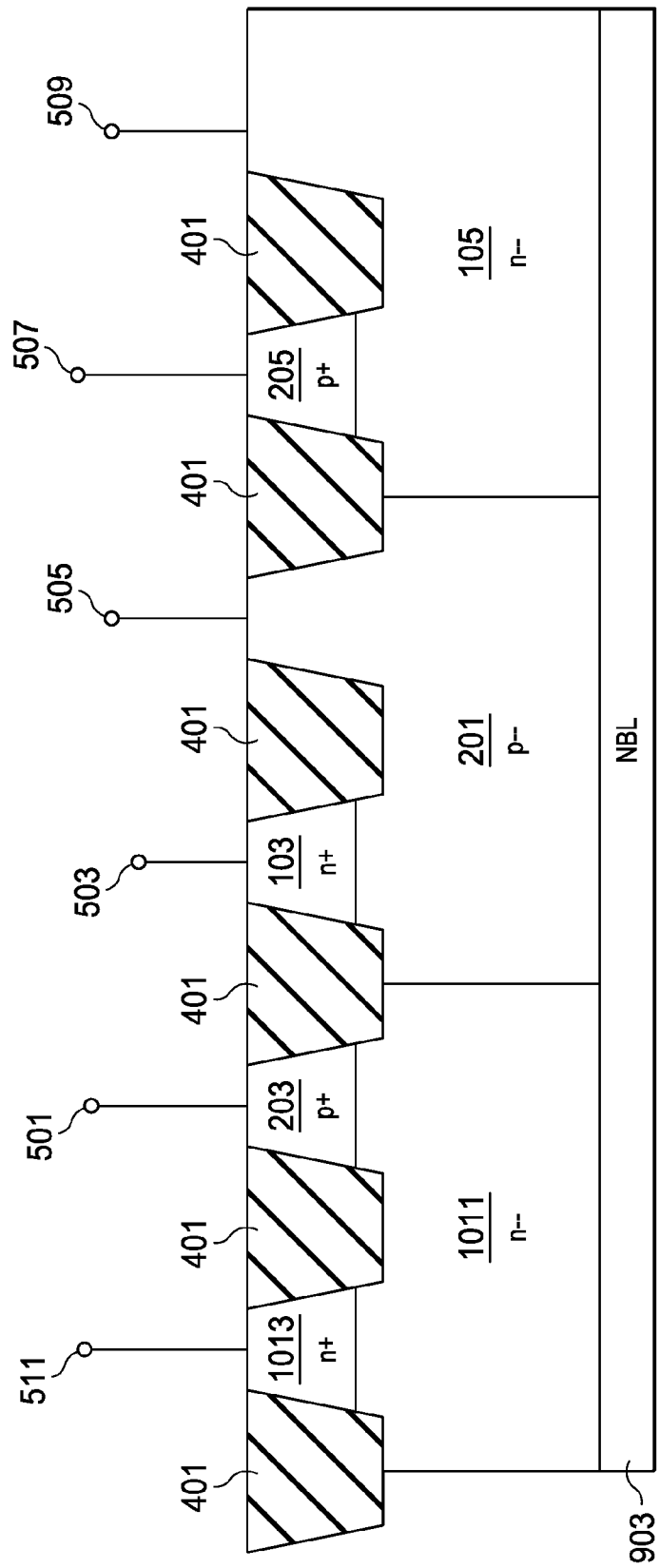
FIGS. 2(a)-2(b) illustrate in cross sectional views additional embodiments of ESD protection circuits.
Figure 2B:
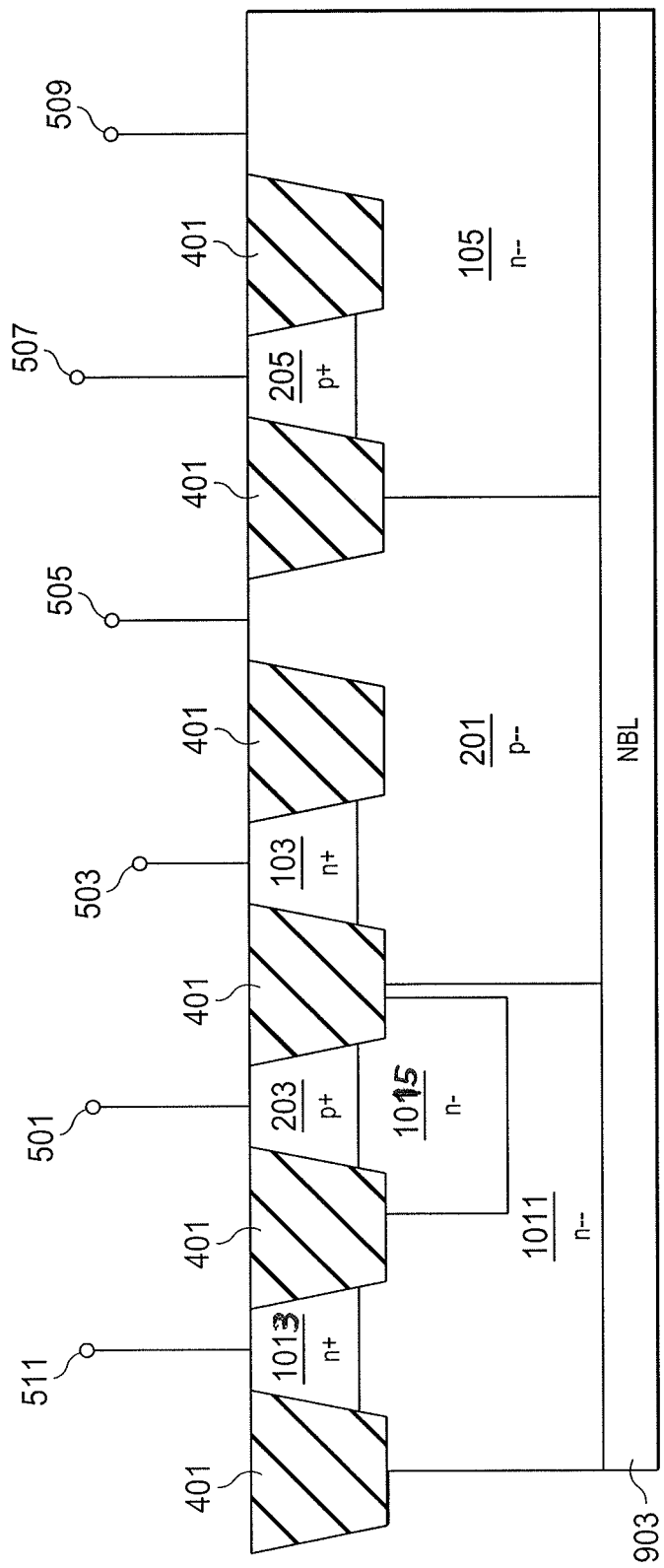

FIGS. 2(a)-2(b) illustrate in cross sectional views additional embodiments of ESD protection circuits, where the first region 101 may comprise multiple parts with different n type materials. For example, as shown in FIG. 2(a), the first region 101 comprises a first part 1011 comprising the first n type material shown as an n−− type material, and a second part 1013 comprising another n type material shown as an n+ type material, while both the first part 1011 and the second part 1013 function together as the first N node of the SCR circuit 200 as shown in FIG. 1(b). Any other n type material may be used for the first part 1011 and the second part 1013 of the first region 101. Furthermore, the second part 1013 in FIG. 2(a) may be contained within the first part 1011, and separated from the fourth region 203 by an isolation area.

Alternatively, as shown in FIG. 2(b), the first region 101 comprises the first part 1011 comprising the first n type material shown as an n−− type material, a third part 1015 comprising another n type material shown as an n− type material, and the second part 1013 comprising yet another n type material shown as an n+ type material in FIG. 2(b), while the first part 1011, the second part 1013, and the third part 1015 function together as the first N node of the SCR circuit 200 as shown in FIG. 1(b). Any other type of n material may be used for any of the first part 1011, the second part 1013, and the third part 1015 of the first region 101.

Similarly as described for FIG. 1(a), the embodiments in FIGS. 2(a)-2(b) further comprise a second region 201, and a third region 105 on an n type barrier layer (NBL) 903, where the NBL 903 is above a substrate, not shown. The second region 201 is shown to comprise a p−− type material, yet any other p type material may be used. The third region 105 is shown to comprise an n−− type material, yet any other n type material may be used. The second region 201 is formed proximate to and adjacent to the first region 101 and the third region 105. An isolation area 401 is formed cross the boundary of the first region 101 and the second region 201, and another isolation area 401 is formed cross the boundary of the second region 201 and the third region 105.

Additional isolation area 401 may be formed within each region 101, 201, and 105. A fourth region 203 is formed within the first region 101 between two isolation areas. A fifth region 103 is formed within the second region 201 between two isolation areas. A sixth region 205 is formed within the third region 105 between two isolation areas. The fourth region 203 is shown to comprise a p+ type material, yet any other p type material may be used. The fifth region 103 is shown to comprise an n+ type material, yet any other n type material may be used. The sixth region 205 is shown to comprise a p+ type material, yet any other p type material may be used.

A contact 511 is formed in connection with the second part 1013 of the first region 101. A contact 501 is formed in connection with the fourth region 203. A contact 503 is formed in connection with the fifth region 103. A contact 505 is formed in connection with the second region 201. A contact 507 is formed in connection with the sixth region 205. A contact 509 is formed in connection with the third region 105.

Figure 3A:
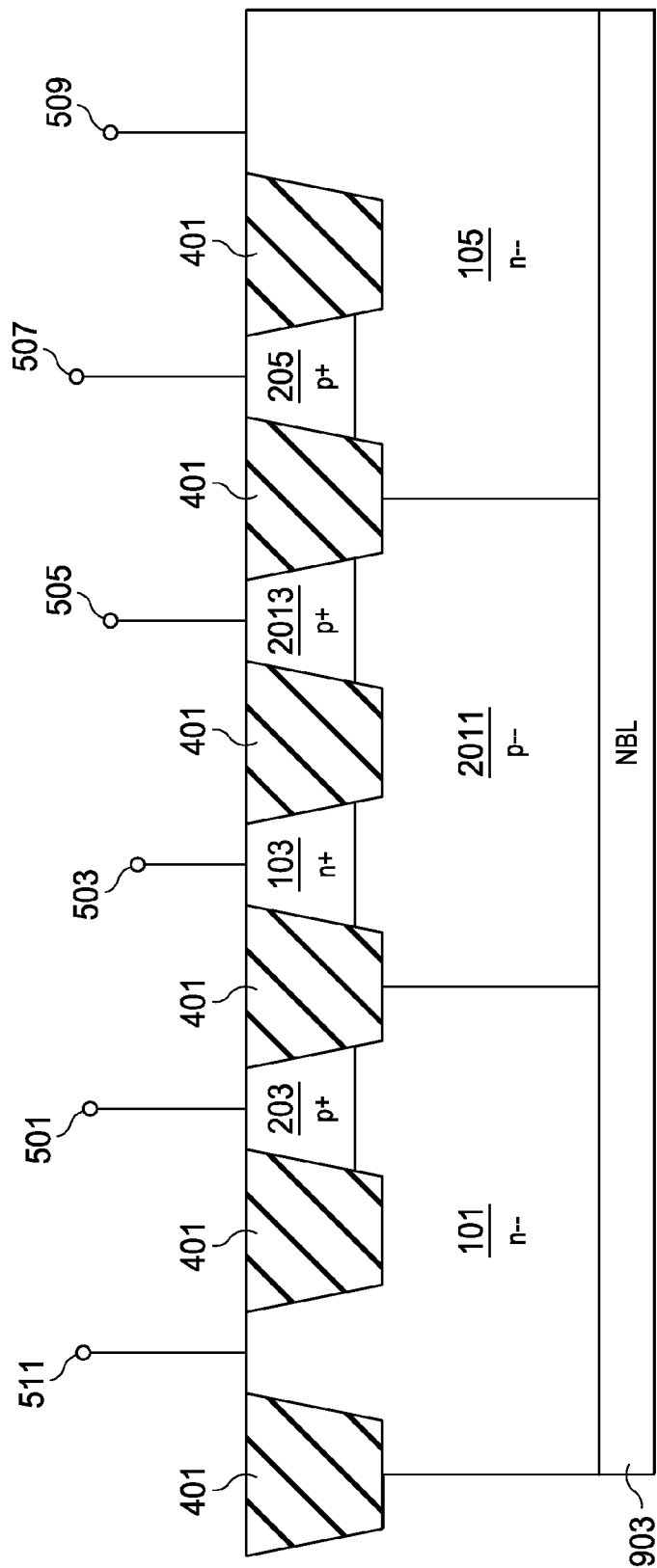
FIGS. 3(a)-3(b) illustrate in cross sectional views additional embodiments of ESD protection circuits.
Figure 3B:
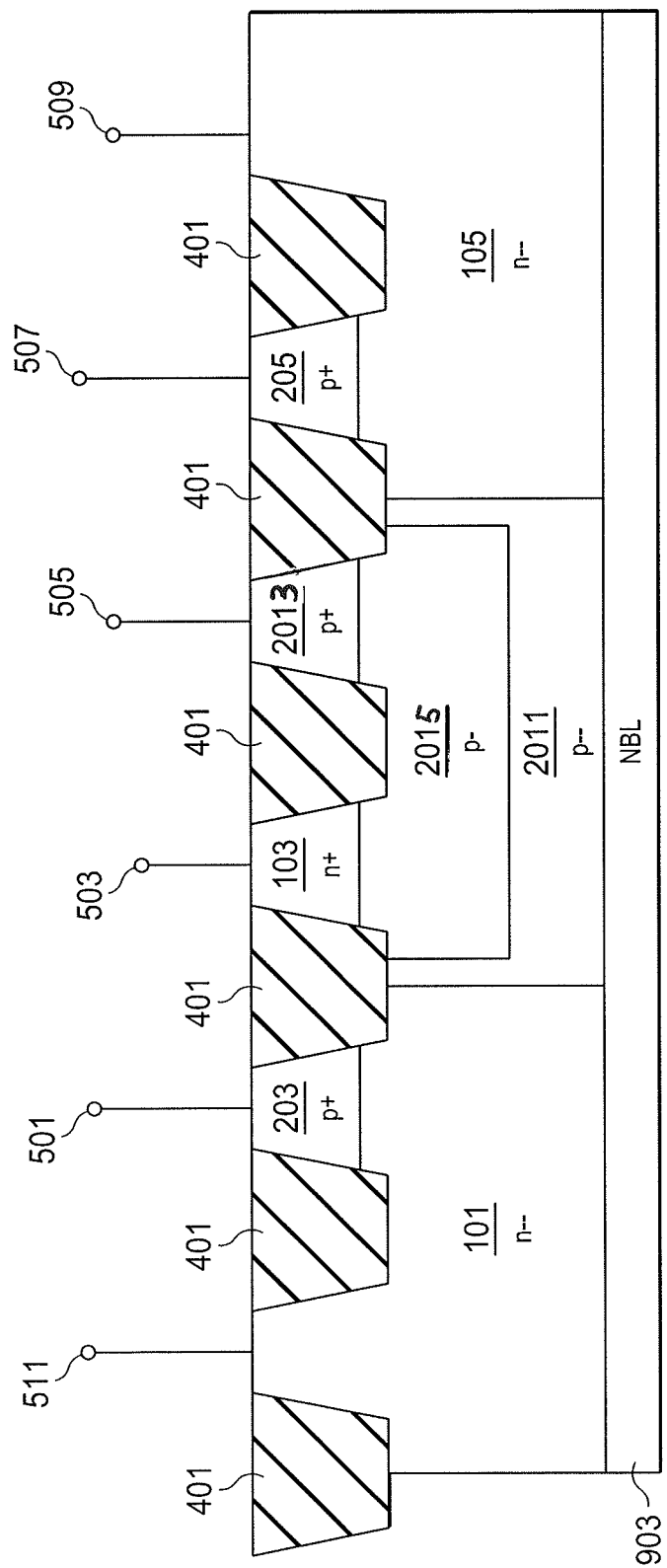

FIGS. 3(a)-3(b) illustrate in cross sectional views additional embodiments of ESD protection circuits, where the second region 201 may comprise multiple parts with different p type materials. For example, as shown in FIG. 3(a), the second region 201 comprises a first part 2011 comprising the first p type material shown as a p−− type material, and a second part 2013 comprising another p type material shown as a p+ type material, while both the first part 2011 and the second part 2013 function together as the second P node 201 for the lateral SCR circuit 200 as shown in FIG. 1(b). As shown in FIG. 3(a), the second part 2013 is formed within the first part 2011.

Alternatively, as shown in FIG. 3(b), the second region 201 comprises the first part 2011 comprising the first p type material shown as a p−− type material, a third part 2015 comprising another p type material shown as a p− type, and the second part 2013 comprising yet another p type material shown as an p+ type in FIG. 2(b), while the first part 2011, the second part 2013, and the third part 2015 function together as the second P node 201 for the lateral SCR circuit 200 and the collector for the lateral PNP circuit 300, as shown in FIG. 1(b). Any other type of p material may be used for any of the first part 2011, the second part 2013, and the third part 2015 of the second region 201.

Similarly as described for FIG. 1(a) and the embodiment in FIGS. 2(a)-2(b), the embodiments in FIGS. 3(a)-3(b) further comprise a first region 101, and a third region 105 on an n type barrier layer (NBL) 903, isolation areas 401, a fourth region 203, a fifth region 103, a sixth region 205, and contacts 501-511. Details of those components shown in FIGS. 3(a)-3(b) are essentially the same as the details for similar components shown in FIGS. 2(a)-2(b) and FIG. 1(a).

Figure 4A:
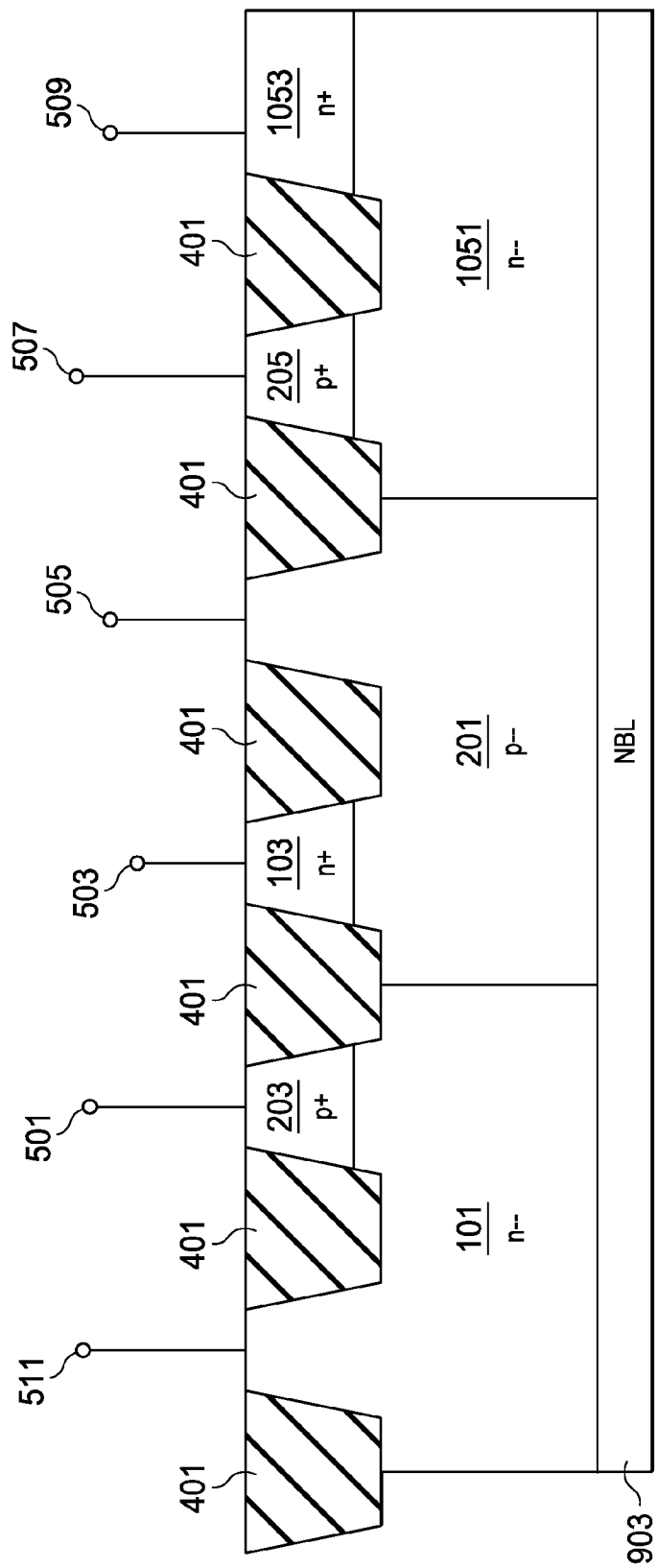
FIGS. 4(a)-4(b) illustrate in cross sectional views additional embodiments of ESD protection circuits.
Figure 4B:
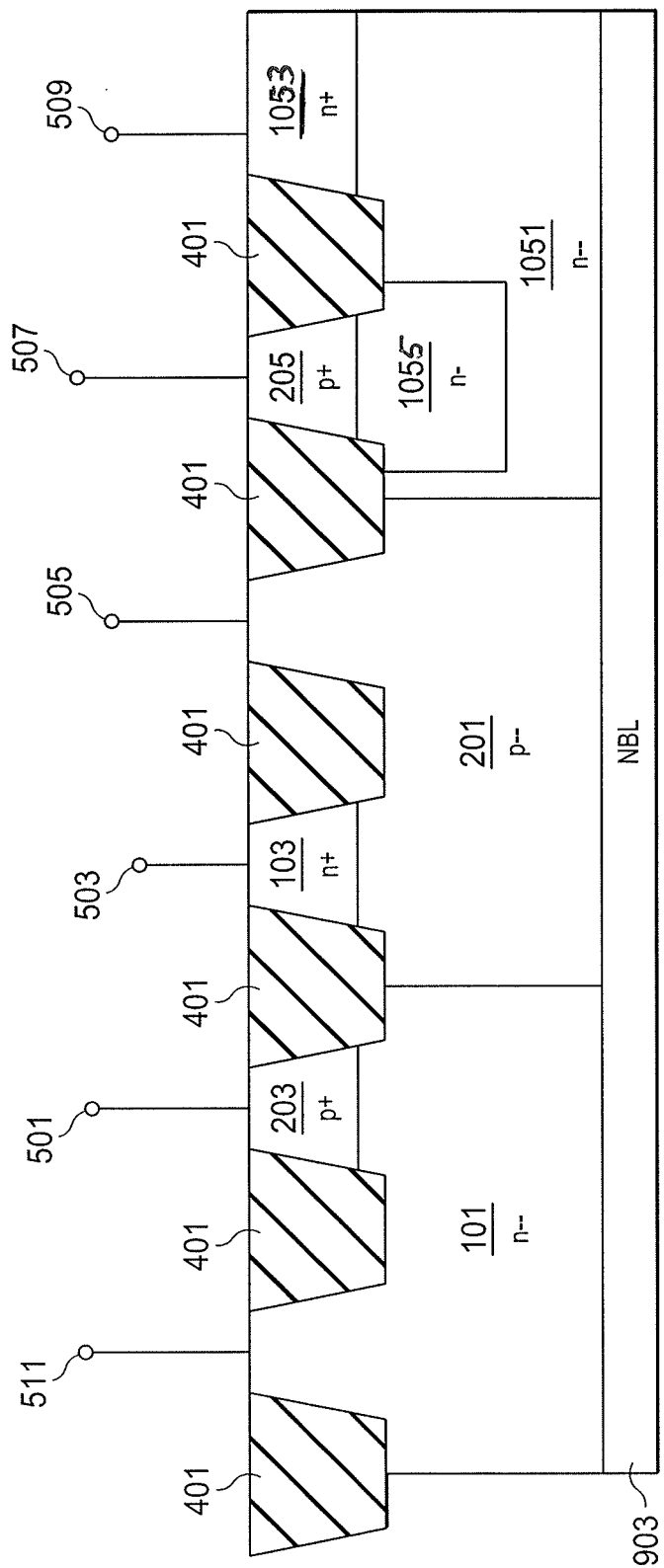

FIGS. 4(a)-4(b) illustrate in cross sectional views additional embodiments of ESD protection circuits, where the third region 105 may comprise multiple parts with different n type materials. For example, as shown in FIG. 4(a), the third region 105 comprises a first part 1051 comprising an n type material shown as an n-- type material, and a second part 1053 comprising another n type material shown as an n+ type material, while both the first part 1051 and the second part 1053 function together as the base 105 of the PNP circuit 300 as shown in FIG. 1(b). Any other n type material may be used for the first part 1051 and the second part 1053 of the third region 105. Furthermore, the second part 1053 in FIG. 4(a) may be contained within the first part 1051, and separated from the sixth region 205 by an isolation area.

Alternatively, as shown in FIG. 4(b), the third region 105 comprises the first part 1051 comprising an n type material shown as an n-- type material, a third part 1055 comprising another n type material shown as an n- type, and the second part 1053 comprising yet another n type material shown as an n+ type in FIG. 4(b), while the first part 1051, the second part 1053, and the third part 1055 function together as the base 105 of the PNP circuit 300 as shown in FIG. 1(b). Any other type of n material may be used for any of the first part 1051, the second part 1053, and the third part 1055 of the third region 105.

Similarly as described for FIG. 1(a) and the embodiment in FIGS. 2(a)-2(b) and FIGS. 3(a)-3(b), the embodiments in FIGS. 4(a)-4(b) further comprise a first region 101, a second region 201 on an n type barrier layer (NBL) 903, isolation areas 401, a fourth region 203, a fifth region 103, a sixth region 205, and contacts 501-511. Details of those components shown in FIGS. 4(a)-4(b) are essentially the same as the details for similar components shown in FIGS. 2(a)-2(b) and FIGS. 3(a)-3(b) and FIG. 1(a).

Various formations of the first region 101 shown in FIGS. 2(a)-2(b), various formations of the second region 201 shown in FIGS. 3(a)-3(b), and the various formations of the third region 105 shown in FIGS. 4(a)-4(b), in addition to those formations not shown, may be combined together to have many different kinds of embodiments for the ESD protection circuit 100.

Figure 5:
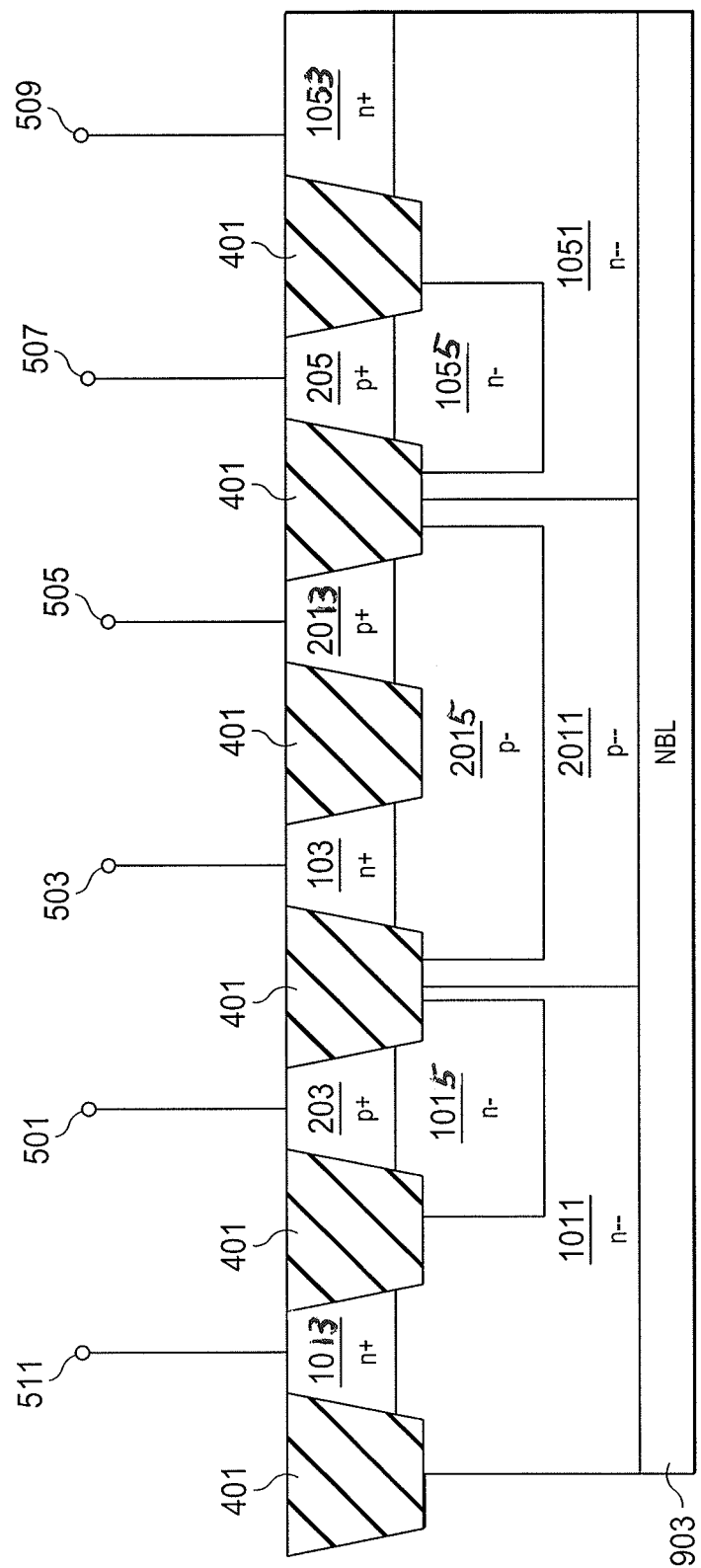
FIG. 5 illustrates an additional embodiment of an ESD protection circuit.

For example, as shown in FIG. 5, the first region 101 comprises three parts, the first part 1011 comprising an n type material shown as an n-- type material, the third part 1015 comprising an n type material shown as an n- type material, and the second part 1013 comprising an n type material shown as an n+ type material. The second region 201 comprises three parts, the first part 2011 comprising a p type material shown as a p-- type material, the third part 2015 comprising a p type material shown as a p- type material, and the second part 2013 comprising a p type material shown as a p+type material. The third region 105 comprises three parts, the first part 1051 comprising an n type material shown as an n- type material, the third part 1055 comprising an n type material shown as an n- type material, and the second part 1053 comprising an n type material shown as an n+type material.

Similarly as described for FIG. 1(a) and the embodiment in FIGS. 2(a)-2(b), FIGS. 3(a)-3(b), and FIGS. 4(a)-4(b), the embodiments in FIG. 5 further comprise isolation areas 401, a fourth region 203, a fifth region 103, a sixth region 205, and contacts 501-511. Details of those components shown in FIG. 5 are essentially the same as the details for similar components shown in FIGS. 2(a)-2(b), FIGS. 3(a)-3(b), and FIGS. 4(a)-4(b), and FIG. 1(a).

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device comprising:
a substrate;
an n type buried layer (NBL) on the substrate;
a first region on the NBL comprising a first n type material;
a second region on the NBL comprising a first p type material and adjacent to and not overlapping with the first region;
a third region on the NBL comprising a second n type material and adjacent to and not overlapping with the second region;
a fourth region comprising a second p type material formed within the first region;
a fifth region comprising a third n type material formed within the second region, and separated from the fourth region by a first isolation area; and
a sixth region comprising a third p type material formed within the third region, and separated from the fifth region by a second isolation area.

2. The semiconductor device of claim 1, wherein the first region comprises a first part comprising the first n type material and a second part comprising a fourth n type material, wherein the fourth region is over the first part of the first region and laterally separated from the second part of the first region.

3. The semiconductor device of claim 2, wherein the first region further comprises a third part comprising a fifth n type material disposed between the fourth region and the first part of the first region.

4. The semiconductor device of claim 3, wherein the first n type material is an n-- type material, the fourth n type material is an n+ type material, and the fifth n type material is an n- type material.

5. The semiconductor device of claim 1, wherein the second region comprises a first part comprising the first p type material, and a second part comprising a fourth p type material, wherein the fifth region is over the first part of the second region and laterally separated from the second part of the second region.

6. The semiconductor device of claim 5, wherein the second region further comprises a third part comprising a fifth p type material disposed between the first part of the second region and each of the fifth region and the second part of the second region.

7. The semiconductor device of claim 6, wherein the first p type material is a p−− type material, the fourth p type material is p+ type material, and the fifth p type material is a p− type material.

8. The semiconductor device of claim 1, wherein the third region comprises a first part comprising the second n type material, and a second part comprising a sixth n type material, wherein the sixth region is over the first part of the third region and laterally separated from the second part of the third region.

9. The semiconductor device of claim 8, wherein the third region further comprises a third part comprising a seventh n type material disposed between the sixth region and the first part of the third region.

10. The semiconductor device of claim 9, wherein the second n type material is an n−− type material, the sixth n type material is an n+ type material, and the seventh n type material is an n− type material.

11. A method forming a semiconductor device, comprising:
providing a substrate;
forming an n type buried layer (NBL) on the substrate;
forming a first region on the NBL, the first region comprising a first n type material, the first region extending to a first depth from a top surface of the substrate;
forming a second region on the NBL, the second region comprising a first p type material and adjacent to the first region, the second region extending to a second depth from the top surface of the substrate, the second depth being substantially equal to the first depth;
forming a third region on the NBL comprising a second n type material and adjacent to the second region;
forming a first isolation area cross a first boundary shared by the first region and the second region, sharing a planar surface with the first region and the second region;
forming a second isolation area cross a second boundary shared by the second region and the third region, sharing the planar surface with the second region and the third region;
forming a fourth region comprising a second p type material within the first region;
forming a fifth region comprising a third n type material within the second region, and separated from the fourth region by the first isolation area; and
forming a sixth region comprising a third p type material within the third region, and separated from the fifth region by the second isolation area.

12. The method of claim 11, wherein forming the first region comprises forming a first part comprising the first n type material and forming a second part comprising a fourth n type material, wherein the fourth region is formed over the first part of the first region and is laterally separated from the second part of the first region.

13. The method of claim 12, wherein forming the first region further comprises forming a third part comprising a fifth n type material disposed between the fourth region and the first part of the first region.

14. The method of claim 13, wherein the first n type material is an n−− type material, the fourth n type material is n+ type material, and the fifth n type material is an n− type material.

15. The method of claim 11, wherein forming the second region comprises forming a first part comprising the first p type material and forming a second part comprising a fourth p type material, wherein the fifth region is formed over the first part of the second region and is laterally separated from the second part of the second region.

16. The method of claim 15, wherein forming the second region further comprises forming a third part comprising a fifth p type material disposed between the first part of the second region and each of the fifth region and the second part of the second region.

17. The method of claim 16, wherein the first p type material is a p−− type material, the fourth p type material is a p+ type material, and the fifth p type material is a p− type material.

18. A semiconductor device comprising:
a substrate;
an n type buried layer (NBL) on the substrate;
a first region on the NBL, wherein the first region comprises a first part of the first region comprising a first n type material and a second part of the first region comprising a fourth n type material, the second part of the first region disposed over a first portion of the first part of the first region;
a second region on the NBL, the second region being adjacent and laterally spaced apart from the first region, wherein the second region comprises a first part of the second region comprising a first p type material, and a second part of the second region comprising a fourth p type material, the second part of the second region disposed over a first portion of the first part of the second region;
a third region on the NBL, the third region being adjacent and laterally spaced apart from the second region, wherein the third region comprises a first part of the third region comprising a second n type material, and a second part of the third region comprising a sixth n type material, the second part of the third region disposed over a first portion of the first part of the third region;
a fourth region comprising a second p type material formed over a second portion of the first part of the first region and laterally separated from the second part of the first region;
a fifth region comprising a third n type material formed over a second portion of the first part of the second region, laterally separated from the second part of the second region, and separated from the fourth region by a first isolation area; and
a sixth region comprising a third p type material formed over a second portion of the first part of the third region, laterally separated from the second part of the third region, and separated from the fifth region by a second isolation area.

19. The semiconductor device of claim 18, wherein the first region further comprises a third part of the first region comprising a fifth n type material and disposed between the fourth region and the second portion of the first part of the first region, the second region further comprises a third part of the second region comprising a fifth p type material and disposed between the fifth region and the first part of the second region, and the third region further comprises a third part of the third region comprising a seventh n type material and disposed between the sixth region and the second portion of the first part of the third region.

20. The semiconductor device of claim 19, wherein the first n type material is an n−− type material, the fourth n type material is an n+ type material, the fifth n type material is an n− type material, the first p type material is a p−− type material, the fourth p type material is a p+ type material, the fifth p type material is a p− type material, the second n type material is an n−− type material, the sixth n type material is an n+ type material, and the seventh n type material is an n− type material.

* * * * *